United States Patent
Rien et al.

(10) Patent No.: US 8,421,501 B1
(45) Date of Patent: Apr. 16, 2013

(54) DIGITAL DATA HANDLING IN A CIRCUIT POWERED IN A HIGH VOLTAGE DOMAIN AND FORMED FROM DEVICES DESIGNED FOR OPERATION IN A LOWER VOLTAGE DOMAIN

(75) Inventors: Mikael Rien, Saint Ismier (FR); Jean-Claude Duby, Biot (FR); Damien Guyonnet, Crolles (FR); Thierry Padilla, Claix (FR)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 13/313,061

(22) Filed: Dec. 7, 2011

(51) Int. Cl.
H03K 19/0175 (2006.01)

(52) U.S. Cl.
USPC ............... 326/81; 326/68; 326/83; 327/333; 327/310; 327/170

(58) Field of Classification Search ............ 327/108, 327/112, 310, 313, 333, 536–538; 326/63, 326/68, 81–83
See application file for complete search history.

(56) References Cited

U.S. PATENT DOCUMENTS

| | | | | |
|---|---|---|---|---|
| 5,804,998 A * | 9/1998 | Cahill et al. | ............... | 327/108 |
| 6,130,557 A * | 10/2000 | Drapkin et al. | ............... | 326/81 |
| 6,268,744 B1 * | 7/2001 | Drapkin et al. | ............... | 326/81 |
| 6,643,110 B2 * | 11/2003 | Allen | ............... | 361/90 |
| 6,693,469 B2 * | 2/2004 | Prodanov | ............... | 327/108 |
| 6,828,856 B2 * | 12/2004 | Sanchez et al. | ............... | 330/253 |
| 6,980,032 B1 * | 12/2005 | Blankenship | ............... | 326/81 |
| 7,495,483 B2 * | 2/2009 | Kumar et al. | ............... | 327/112 |
| 8,237,422 B2 * | 8/2012 | Singh et al. | ............... | 323/282 |
| 2010/0264974 A1 * | 10/2010 | Rien et al. | ............... | 327/313 |

OTHER PUBLICATIONS

A. Annema et al, "5.5-V I/O in a 2.5-V 0.25-μm CMOS Technology" *IEEE Journal of Solid-State Circuits*, vol. 36, No. 3, Mar. 2001, pp. 528-538.

G.P. Singh et al, "High-Voltage-Tolerant I/O Buffers with Low-Voltage CMOS Process" *IEEE Journal of Solid-State Circuits*, vol. 34, No. 11, Nov. 1999, pp. 1512-1525.

* cited by examiner

*Primary Examiner* — Vibol Tan
(74) *Attorney, Agent, or Firm* — Nixon & Vanderhye P.C.

(57) ABSTRACT

Circuitry, operating in a high voltage domain, including a high and low voltage inputs, and including a plurality of devices designed to operate optimally powered in a native voltage domain that is lower voltage than said high voltage domain and some devices arranged in two sets. The circuitry including a further input for receiving the high native voltage level. Each set having at least one device, a first set being arranged to receive an intermediate low reference voltage level as a low voltage level signal and the high voltage level as a high voltage level signal and the second set being arranged to receive the high native voltage level as a high voltage level signal and the low voltage level as a low voltage level signal. The intermediate low reference voltage level includes a voltage level generated by subtracting the high native voltage level from the high voltage level.

12 Claims, 6 Drawing Sheets

US 8,421,501 B1

DIGITAL DATA HANDLING IN A CIRCUIT POWERED IN A HIGH VOLTAGE DOMAIN AND FORMED FROM DEVICES DESIGNED FOR OPERATION IN A LOWER VOLTAGE DOMAIN

BACKGROUND OF THE INVENTION

1. Field of the Invention

The field of the invention relates to the field of digital data handling and in particular to providing an intermediate voltage to enable devices designed to operate in one voltage domain to operate in a circuit powered in a higher voltage domain.

2. Description of the Prior Art

Advances in the field of electronics have led to a reduction in transistor dimensions and oxide thickness in order to increase processing speeds and reduce area. A corresponding reduction in the voltage powering both core and input-output devices in order to increase speed and reduce power consumption have also occurred.

Thus, for devices of 45 nm, the "standard" external power is now 1.8V where it was previously 3.3V or 2.5V. In order to be able to reach high frequencies the oxide thickness has been decreased and is now around 28 to 32 Å for 1.8V devices (where previously it was about 50 Å). Devices of lower sizes will operate at even lower voltages.

Apparatus that operate with these new smaller more fragile devices in circuits may have to handle signals suitable for the old higher voltage domains. For example, to be compatible with some older chips and a few standard protocols some input-output cells must operate at a nominal 3.3V in order to be able to generate signals at this level using the devices that operate at a nominal 1.8V.

In order to ensure that these devices are not overstressed with the accompanying problems of oxide breakdown and lifetime degradation due to HCI (hot carrier injection) precautions need to be taken.

One way of protecting the devices is to provide an intermediate voltage supply, such that the higher voltage domain is divided in two.

This intermediate voltage supply may be the high voltage supply of the lower power domain of the new devices, in this example 1.8V. The devices can then be arranged either between this intermediate voltage level and the high voltage level of the higher voltage domain, in this case 3.3 V, or between the intermediate voltage level and ground. In this way the devices only see 1.8V or 3.3 V-1.8 V that is 1.5V across them and they are protected.

An advantage of such a system is that there will already be a voltage supply supplying the 1.8V level and thus, no additional voltage level generator is required. Voltage level generators take both power and area. However, a disadvantage is that if the voltage level of the high voltage level domain varies, there are corresponding variations in the intermediate level voltage. Furthermore, devices operating between 3.3V and 1.8V have 1.5 V across them so that they will operate more slowly than those operating close to the optimal operation point of 1.8V.

An alternative solution would be to provide an intermediate voltage that is the high voltage level divided by two. This would mean that both halves of the circuit would have the same voltage difference across them. However, an additional voltage level generator that consumes power and area is required and again the voltage difference used to power the devices is quite far from the optimal value resulting in slower operating speeds.

It would be desirable to provide a flexible system that can handle higher voltage levels using devices that are designed for lower voltage levels and yet can maintain a voltage level close to the optimal operating voltage levels across the devices even where the input high voltage level varies.

SUMMARY OF THE INVENTION

A first aspect of the present invention provides circuitry for handling a digital signal, said circuitry comprising a high voltage input for receiving a high voltage level and a low voltage input for receiving a low voltage level, said circuitry comprising:

a plurality of devices, said plurality of devices being designed to operate optimally when powered in a native voltage domain, wherein when said low voltage level is equal to a low native voltage level, a high native voltage level is lower than said high voltage level;

a further input for receiving said high native voltage level;

at least some of said plurality of devices of said circuitry being arranged in two sets, each set having at least one device, a first set being arranged in an upper voltage domain having an intermediate low reference voltage level as a low voltage level and said high voltage level as a high voltage level and a second set being arranged in a lower voltage domain having said high native voltage level as a high voltage level and said low voltage level as a low voltage level; wherein said intermediate low reference voltage level comprises a voltage level generated by subtracting said high native voltage level from said high voltage level, such that said devices of said first and said second set operate at or close to an optimal operating voltage difference.

The present invention recognises that when devices are operating in systems that are powered by voltage differences that are greater than the voltage differences that the devices are designed for, although they can be protected by the use of an intermediate voltage level, this intermediate voltage level may not provide the optimal voltage difference for these devices. Devices that operate at voltage differences that are different to those that they were designed for operate more slowly and less reliably. The present invention also recognises that the high native voltage level that the devices are designed for will be available somewhere in the system and can therefore be input and used as one intermediate voltage level. Thus, one set of devices can operate between this voltage level and the low voltage level that is generally common across a system and may be ground. These devices will therefore be operating at or close to their optimal voltage operating conditions. However, the devices operating in the higher part of the voltage region, if they use this intermediate voltage level as their low voltage level may not be operating close to their optimal voltage difference, as they will have the high voltage level minus this native high voltage level fall across them. Unless the high native voltage level is exactly half the value of the high voltage level then these devices will not be operating close to their optimal voltage operating conditions.

The present invention addresses this problem by generating a further intermediate voltage which is used as a low intermediate reference voltage for the set of devices operating in the higher part of the voltage domain. This voltage level is generated from a difference between the high voltage level and the native high voltage level and is used as an intermediate low reference voltage for devices in the higher part of the voltage domain. Thus these devices will also operate with a voltage difference at or at least close to the native voltage difference and will therefore operate at or close to their optimal operating point. Furthermore by providing an intermediate voltage level generated in this way, changes in the high voltage level will not affect the voltage drop across the devices (as it will affect both the high voltage level and low voltage level they see). This enables the circuitry to not only operate with high voltage levels that are fairly unstable but also enables the same circuitry to be used to deal with multiple high voltage levels, so that systems designed to operate with a high voltage level of say 3.3 V and ones with a high voltage level of 2.5 V can both use this circuitry.

Furthermore as one of the intermediate voltage levels used is the native voltage level only one voltage generator is required to generate the other intermediate voltage level which has advantages as voltage generators are expensive on power and area.

In some embodiments, said circuitry further comprises a voltage level generator configured to generate said intermediate low reference voltage level, said voltage level generator receiving said high voltage level and said high native voltage level and comprising voltage difference generation means for generating a voltage level equal to the voltage difference between said received high voltage level and said received high native voltage level and outputting said voltage difference as said intermediate low reference voltage level.

Although the intermediate low reference voltage level may be received from an external source, in some embodiments it is generated by a voltage level generator within the circuitry itself. As noted previously, generating an intermediate low reference voltage level that depends on the high voltage level and the high native voltage level means that it can track any variation in the high voltage level and the devices powered between this intermediate low reference voltage level and the high voltage level can have a relatively constant voltage difference maintained across them that is at or close to the optimal operating voltage difference of the devices.

In some embodiments, the circuitry is input output circuitry and comprises a data input for receiving an input digital data signal having an input high voltage level that is lower than said high voltage level and an input low voltage level at said low voltage level and a data output for outputting a digital data signal having said high voltage level and said low voltage level; wherein said first set of devices comprises a first voltage level shifter powered between said high voltage level and said intermediate low reference voltage level and configured to shift said voltage level of said received input digital data signal from said input high voltage level to said high voltage level and said input low voltage level to said intermediate low reference voltage level; and said input output circuitry comprises a first switching device configured to connect or isolate said high voltage level and an output, said first switching device being controlled by said signal output by said first voltage level shifter;

said second set of devices comprises a second voltage level shifter powered between said native high voltage level and said low voltage level and configured to shift said high voltage level of said received input digital data signal to said high native voltage level; and said input output circuitry comprises a second switching device configured to connect or isolate said low voltage level and said output, said second switching devices being controlled by said signal output by said second voltage level shifter.

Embodiments of the present invention are particularly applicable to input/output circuitry that receives digital data signals from devices operating in lower voltage domains and converts them to signals of a higher voltage domain for receipt by circuits operating in this higher voltage domain. In this embodiment the input/output circuitry is formed of devices configured to operate in a native voltage domain that is different to both the voltage domain of the input signals and the voltage domain of the output signals. The embodiment addresses this by splitting the higher voltage domain into two parts an upper part having a first set of devices within it and having a high voltage level equal to the high voltage level of the higher voltage domain and a low voltage level equal to the intermediate low reference voltage that is the high voltage level minus the high native voltage level and the lower part being powered by the high native voltage level and the low voltage level and comprising the second set of devices. In this way both sets of devices see the native voltage difference across them.

The first set of devices level shifts the input digital data signal to the voltage levels of the upper part of the voltage domain and this signal controls a first switching device that is configured to connect or isolate the high voltage level from the output. In this way, the high voltage level of the high voltage level domain may be connected to the output to produce a high level signal in response to the digital data input signal.

The second set of devices level shifts the same input digital data signal to the voltage levels of the lower part of the voltage domain and this signal controls a second switching device that connects the output to the low voltage level. Thus, the digital data signal controls whether the output receives the high voltage level or the low voltage level and in this way an input/output device that receives a digital data signal in one voltage domain and converts it to a higher voltage domain is produced.

In some embodiments, said first voltage level shifter comprises a pre-driver powered between said high voltage level and said intermediate low reference voltage level and said second voltage level shifter comprises a pre-driver powered between said high native voltage level and said low voltage level.

Although the first voltage level shifter can be made in a number of ways in some embodiments it will include a pre-driver that is powered between the high voltage level and the intermediate low voltage level and the second voltage level shifter will include a pre-driver powered between the high native voltage level and the low voltage level.

In some embodiments, said first switching device comprises a PMOS transistor arranged in series with a further at least one PMOS transistor, said further at least one PMOS transistor being configured to receive said intermediate low reference voltage at its gate.

The first switching device may comprise a transistor as this will switch in response to a digital input signal and can therefore be used to connect or isolate the high voltage rail and the output in response to this signal. This transistor should be cascaded with a further at least one transistor to avoid the full high voltage level falling across a single transistor.

In this embodiment PMOS transistors are selected so that the gate of one of the transistors can be held at the intermediate low reference voltage level making it permanently on and providing an intermediate voltage level which prevents the full voltage difference of the high power domain falling across one of the transistors.

This does means that the switching device connects the high voltage level to the output in response to the input signal having a low value and thus, acts to invert the signal. This is not a problem as an inverter need simply be added to the system at some point, either to invert the input signal or the output signal.

In some embodiments, said second switching device comprises a NMOS transistors arranged in series with a further at least one NMOS transistor, said further at least one NMOS transistor being configured to receive said high native voltage level at its gate.

Similarly the second switching device can be cascaded NMOS transistors which switch on in response to the digital data signal being high and therefore connect the low voltage level to the output when the digital data signal is high providing the other level of the output digital data signal. In a similar way to the PMOS transistors, the NMOS transistor that is permanently on receives at its gate the $V_{native}$ level permanently which avoids the full voltage level of the high voltage domain falling across the transistors.

A second aspect of the present invention provides an integrated circuit comprising: a plurality of components including at least one core for generating a data signal; a plurality of voltage rails configured to transmit voltage levels to said plurality of components, said plurality of voltage rails comprising: a first voltage rail comprising a high voltage rail for transmitting a high voltage level; a second voltage rail comprising a low voltage rail for transmitting a low voltage level; a third voltage rail for transmitting an intermediate voltage level that is lower than said high voltage level, said intermediate voltage level being a high voltage level for powering said processor core; an input output cell for receiving said data signal from said core and for converting a high voltage level of said data signal to a higher voltage level, said input output cell comprising input output circuitry according to a first aspect of the present invention.

Integrated circuits may comprise cores that generate data signals in a first low voltage domain as they are often formed of small devices that operate in a low voltage domain in order to increase operating speeds and reduce power consumption. These data signals may be output to devices that operate in higher voltage domains such as a USB port. Thus, the integrated circuit may require input/output cells to convert the digital data signal from this low voltage domain to the higher voltage domain. The input/output cells may contain devices that operate at an intermediate or native voltage domain. Thus, the low voltage domain data signal needs to be shifted using level shifters formed of devices designed for the intermediate native voltage domain to generate the high voltage domain signal.

The input/output circuitry of embodiments of the present invention is particularly suitable for this purpose as the generation of an intermediate low reference voltage level that is the high voltage level minus the native voltage level and the use of the native voltage level as a high intermediate reference voltage enables the devices of the input/output cell to operate at or at least close to their optimal operating voltage conditions.

Although the voltage level generator may be within the input/output cell itself, it may be in a different part of the circuit and the intermediate low reference voltage level may be received via a voltage rail. If the input/output cell does have a voltage level generator then it may output the generated intermediate low reference voltage level to a voltage rail such that it can be transmitted to and used by other input/output cells on the integrated circuit.

A third aspect of the present invention provides a method for handling a digital signal, using circuitry powered in a high voltage domain between a high voltage level and a low voltage level, said circuitry comprising a plurality of devices, said plurality of devices being designed to operate optimally powered between a native voltage difference, wherein when said low voltage level is equal to a low native voltage level, a high native voltage level is lower than said high voltage level; said method comprising: receiving said high voltage level of said high voltage domain; receiving said high native voltage level; receiving said low voltage level; generating an intermediate low reference voltage level by subtracting said high native voltage level from said high voltage level of said high voltage domain; arranging at least some of said plurality of devices of said circuitry in two sets, each set having at least one device, a first set being arranged to receive said intermediate low reference voltage level as a low voltage level signal and said high voltage level as a high voltage level signal and a second set being arranged to receive said high native voltage level as a high voltage level signal and said low voltage level as a low voltage level signal.

A fourth aspect of the present invention provides a means for handling a digital signal, said means comprising a high voltage input means for receiving a high voltage level and a low voltage input means for receiving a low voltage level, said means for handling data comprising: a plurality of devices, said plurality of devices being designed to operate optimally powered between a native voltage difference, wherein when said low voltage level is equal to a low native voltage level, a high native voltage level is lower than said high voltage level; a further input means for receiving said high native voltage level; a voltage level generator means for generating an intermediate low reference voltage level, said voltage level generator means receiving said high voltage level and said high native voltage level and comprising voltage difference generation means for generating a voltage level equal to the voltage difference between said received high voltage level and said received high native voltage level and outputting said voltage difference as said intermediate low reference voltage level; and a data input means for receiving an input digital data signal having an input high voltage level that is lower than said high voltage level and an input low voltage level at said low voltage level and a data output means for outputting a digital data signal having said high voltage level and said low voltage level; wherein at least some of said plurality of devices of said circuitry are arranged in two sets, each set having at least one device, a first set being powered between said high voltage level and said intermediate low reference voltage level and a second set being powered between said high native voltage level and said low voltage level such that said devices of said first and said second set operate at or close to an optimal operating voltage difference.

The above, and other objects, features and advantages of this invention will be apparent from the following detailed description of illustrative embodiments which is to be read in connection with the accompanying drawings.

BRIEF DESCRIPTION OF THE DRAWINGS

FIG. 4b schematically shows a cross section of the integrated circuit of FIG. 4a.

DESCRIPTION OF THE PREFERRED EMBODIMENTS

Figure 1:
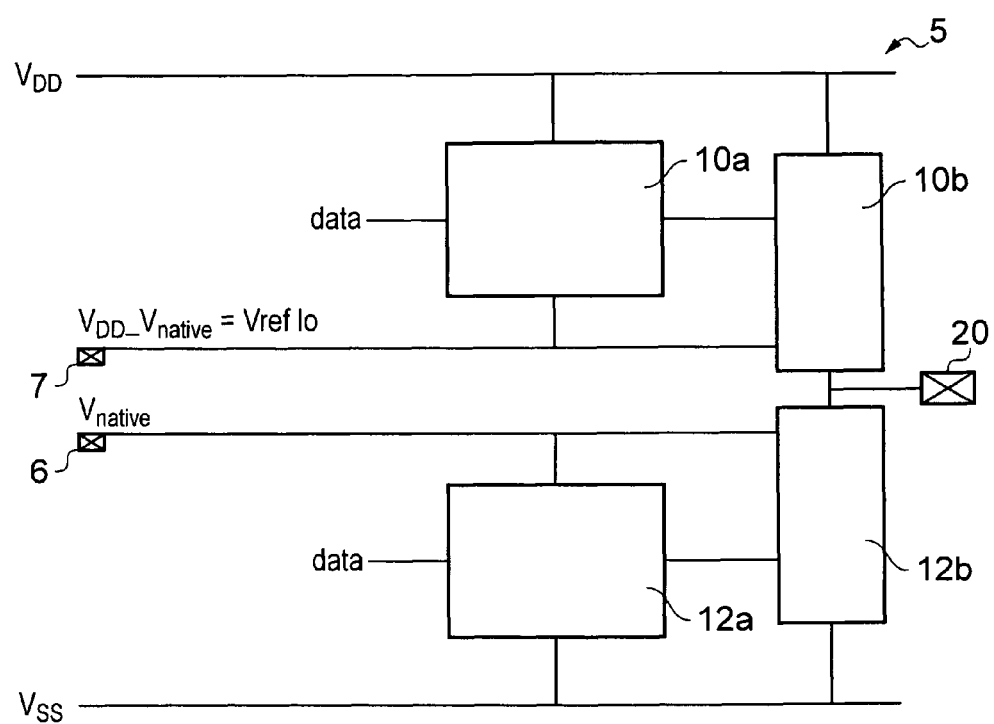
FIG. 1 schematically shows circuitry according to an embodiment of the present invention.

FIG. 1 schematically shows circuitry 5 powered in a high voltage domain between VDD and VSS using devices that are designed to operate in a lower native voltage domain. In this embodiment the devices are arranged in sets. A first set 10a operate in a higher part of the high voltage domain and a second set 12a operate in a lower part of the voltage domain. Devices 10b and 12b are arranged to receive intermediate voltage level signals from the upper and lower parts to avoid them seeing the full voltage difference VDD–VSS.

The devices are not shown individually but are shown as blocks in this diagram. As these devices are designed to operate in a native voltage domain then in order to provide suitable operational voltage levels two intermediate voltage levels are used. The first intermediate voltage level is simply the high voltage level of the native voltage domain, $V_{native}$ and as this will be present somewhere in the system it can simply be received at an input 6 to the circuitry 5.

This voltage level is used as a high voltage level for a lower part of the voltage domain and the second set of devices 12a are powered between this voltage level and VSS, while the set of devices 12b receive signals at these two voltage levels at their inputs. This means that the set of devices 12a at least see a voltage difference at or close to their optimal voltage difference and therefore operate at or close to their optimal operating point.

Devices in the higher part of the voltage domain 10a see the high voltage level VDD as their high voltage signal. In order for them to receive a voltage difference of $V_{native}$ a second intermediate voltage is used as a reference intermediate low voltage for this higher voltage domain. This voltage level is the high voltage level minus the native voltage level and is termed $V_{reflow}$. In this embodiment this is received at an input 7 to the circuitry but in some embodiments it is generated inside the circuitry. By using this as the reference low voltage level for devices in the higher part of the voltage domain these devices also see $V_{native}$ across them. In this embodiment a data signal is input for devices 10a and 12a and is processed by these devices. A signal is output by devices 10a and 12a to the output devices 10b and 12b respectively which provide connections between VDD and VSS and output 20 thereby generating a signal in the high voltage domain that is output on output pad 20.

Thus, although the devices within circuitry 5 are devices designed to operate in a lower voltage domain than the voltage domain that is powering circuitry 5, a data signal in this higher voltage domain can be output using these devices and the two intermediate voltage levels. Furthermore, by the use of two intermediate levels the devices operate at or close to their optimal operating points making the circuitry fast and reliable.

Figure 2:
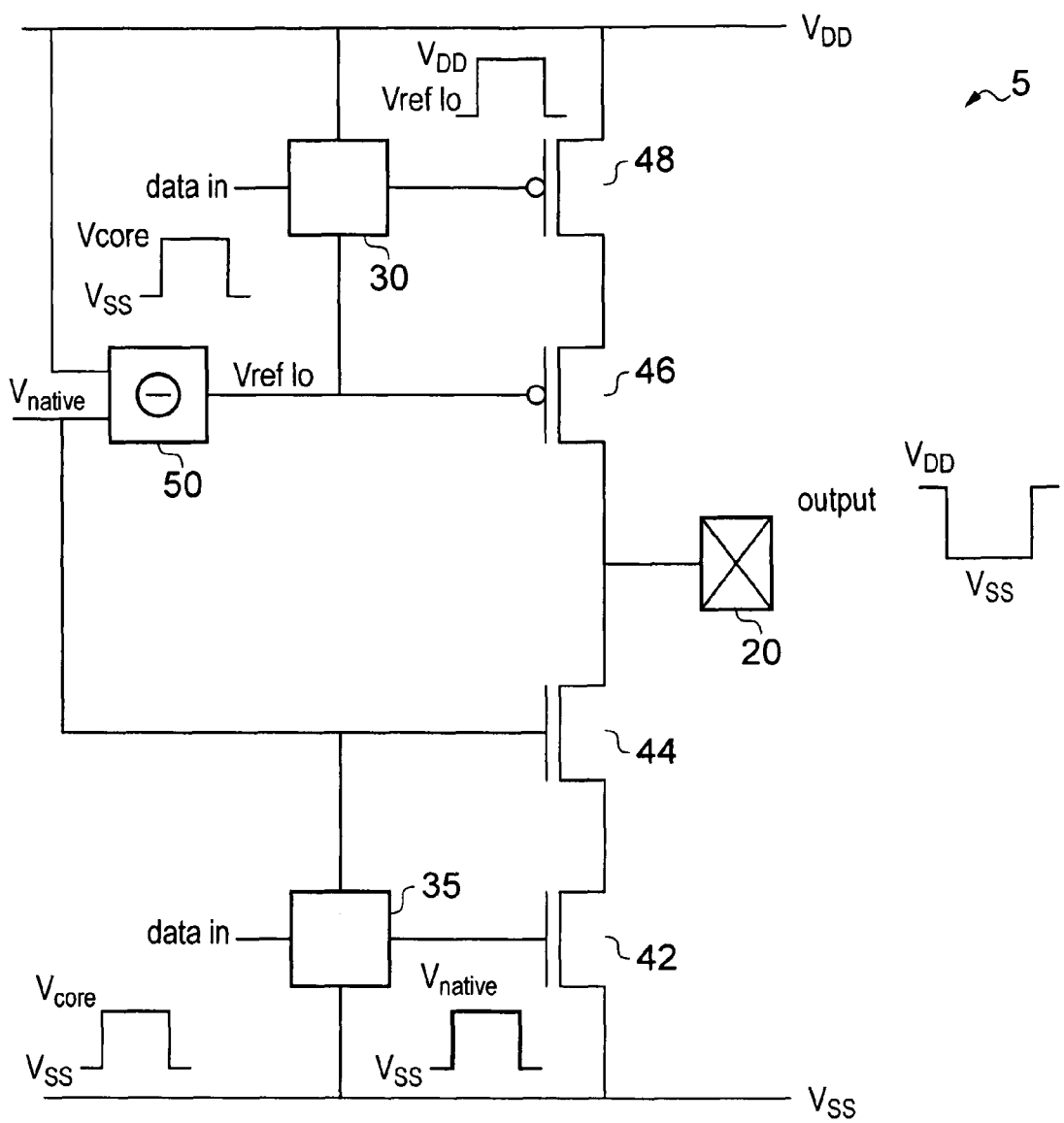
FIG. 2 schematically shows an input/output cell according to an embodiment of the present invention.

FIG. 2 shows a further embodiment of circuitry 5. In this embodiment there is a first level shifter 30 and a second level shifter 35. The first level shifter 30 is powered in the higher part of the high voltage domain and has the high voltage level VDD as a high voltage level and the reference intermediate low voltage level $V_{reflow}$ as a low voltage level. This level shifter 30 receives a data signal in a lower voltage domain and shifts the signal to the levels of the voltage domain that it is powered in. In this embodiment the received data signal has one of two voltage levels VSS or $V_{CORE}$ and is shifted to have one of two voltage levels $V_{reflow}$ or or VDD. This makes the signal suitable for switching the PMOS transistors 48 that forms part of the output circuitry.

The second voltage level shifter 35 also receives the data signal varying from $V_{CORE}$ to VSS and is powered by the high voltage level $V_{native}$ and the low voltage level VSS. It therefore shifts the voltage level of the input data signal from VSS and $V_{CORE}$ to VSS and $V_{native}$. This shifted data signal is input to the gate of NMOS transistor 42 that forms part of the output circuitry.

In this embodiment the intermediate reference low voltage level for the higher voltage domain is generated by a voltage level generator 50 which receives the $V_{native}$ signal at its input and the VDD signal and generates this intermediate reference low voltage level by subtracting the $V_{native}$ signal from the VDD signal. In this way the intermediate reference low signal will track any variations in VDD and no matter what the level of VDD provided it is higher than $V_{native}$, $V_{native}$ will fall across the level shifter 30.

The output part of the circuitry is a cascaded switching device 42, 44, 46 and 48 which allows the output pad 20 to be connected to, either VDD or VSS and therefore allows an output digital data signal in the higher voltage domain to be generated. In this embodiment PMOS transistor 48 is controlled by the level shifted data signal output from level shifter 30 while PMOS transistor 46 receives the intermediate low reference voltage signal and is thus, permanently on. Thus, when the data signal is high PMOS transistor 48 turns off and the output 20 is isolated from the high voltage level. However, when the data signal is low the output of the level shifter 30 falls to $V_{reflow}$ and transistor 48 turns on and as transistor 46 is on, the output 20 receives VDD.

Similarly for the NMOS transistors 42 and 44 when the data signal is low then the level shifter outputs VSS and transistor 42 is turned off and the output is isolated from VSS. At this point as explained above the PMOS transistors 48 and 46 are turned on and therefore VDD is output. When the input data signal goes high then transistor 42 sees $V_{native}$ and as transistor 44 also sees $V_{native}$ they are both turned on and VSS is connected to the output 20. In this way, an inverted data signal to that input that is shifted to a higher voltage domain is generated.

It is important that transistors 42 and 44 and transistors 46 and 48 are cascaded in this way and that the transistor that is always on permanently receives one of the intermediate voltage levels as this prevents the full voltage level of the higher voltage domain falling across a single transistor when the output is outputting one of the high or low voltage levels.

Figure 3:
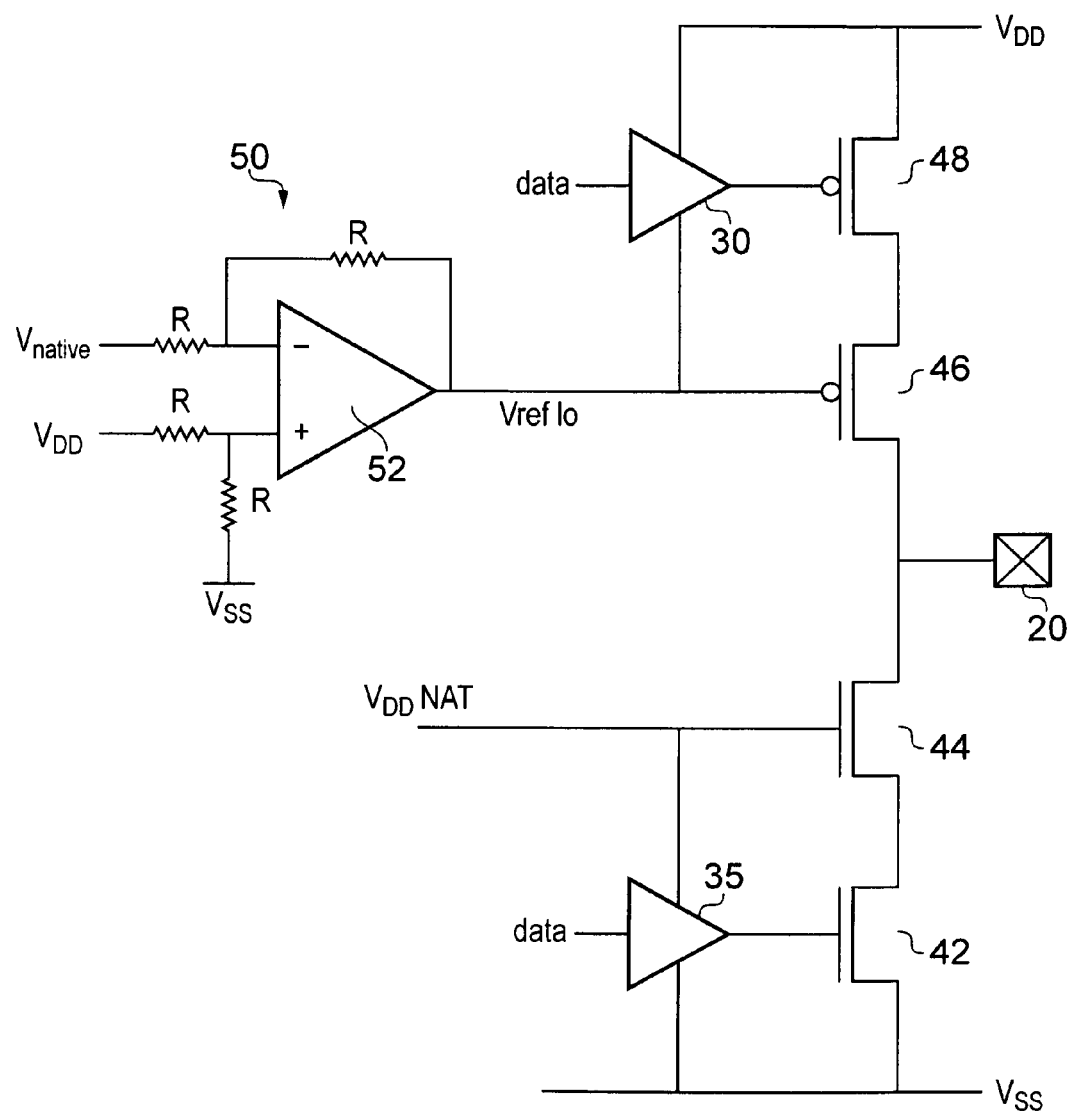
FIG. 3 schematically shows in greater detail the input/output cell of FIG. 2.

FIG. 3 shows circuitry similar to that of FIG. 2 in more detail. Thus, the voltage generator 50 for generating the $V_{reflow}$ is shown as an operational amp 52 that receives both the native high voltage level $V_{native}$ and the high voltage level VDD and using voltage dividers generates the $V_{reflow}$ which is VDD–$V_{native}$.

The two level shifters are shown as buffers 30 and 35 which comprise pre-drivers and are powered between one of the two intermediate voltage levels and either the high or the low voltage level. The data signals that are received from a different part of the system and from yet a further voltage domain are level shifted by the voltage level shifters 30 and 35 to generate signals that vary between VDD and $V_{reflow}$ in the case of level shifter 30 and $V_{native}$ and VSS in the case of the level shifter 35. These signals are sufficient to switch the transistors 48 and 42 respectively and the data signal that is received is converted to an inverted signal in the higher voltage domain and output at output 20.

Thus, in this embodiment an input/output cell that receives a data signal in one voltage domain and shifts it to a higher voltage domain is formed using devices that operate in a yet different voltage domain. These devices will operate at or close to their optimal point by the careful selection of the intermediate reference voltages that provide the required voltage level differences across the devices.

Figure 4A:
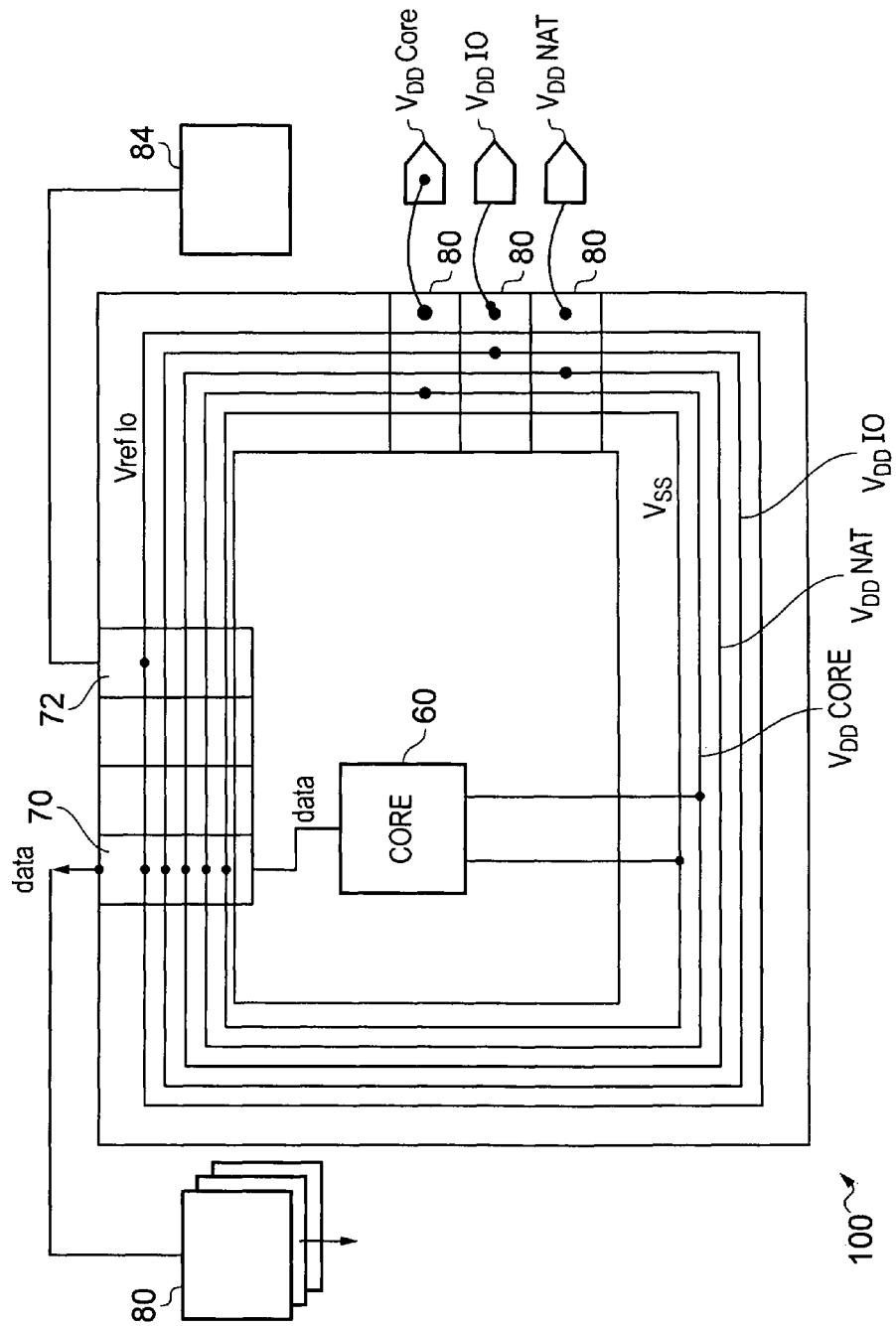
FIG. 4a schematically shows an integrated circuit according to an embodiment of the present invention.

FIG. 4a shows an integrated circuit according to an embodiment of the present invention. In integrated circuits such as integrated circuit 100 the cores often use small fast transistors that operate in a low voltage, domain for power and speed reasons. However, they may need to communicate with external devices that cannot operate in these voltage domains and therefore the signals need to be voltage level shifted. Input/output cells on the edge of the integrated circuit can provide this function.

In this embodiment integrated circuit 100 has a core 60 that operates in a voltage domain between $V_{CORE}$ and VSS and generates a data signal that it outputs to an input/output cell 70. This data signal is level shifted within the input output cell using to a higher voltage domain that is suitable for a peripheral device 80 which in this embodiment is a USB port.

The integrated circuit 100 has voltage rails running around the edge of the cells that supply the power to the various portions of the cells. Thus, there is a low voltage level rail VSS that is common to all of the voltage domains. There is a VDD core voltage rail which provides the high voltage level for core 60, a VDDNAT which provides the high voltage level for devices within the input/output cells 70 and 72, and VDDIO which is the high voltage level that peripheral devices 80 and 84 operate at.

In this example, $VDD_{CORE}$ is 1V while VDDNAT is 1.8 V and VDDIO is 3.3V. Although VDDIO is 3.3V in this example with this value of VDDNAT it could be any level above 1.8V and below 3.6V.

Figure 4B:
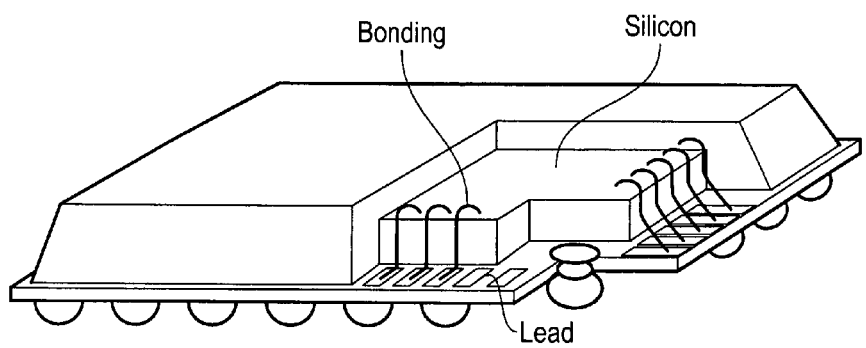

These voltage rails are connected to external pins for the supply of the voltage levels at cells 80. FIG. 4b shows these external connections in more detail.

In this embodiment input/output cell 70 receives $V_{reflow}$ from a voltage rail on the edge of the integrated circuit 100 and uses this as its intermediate voltage level. This voltage level is generated by a further input/output cell 72 which has a voltage generator within it and supplies the voltage level generated to the $V_{reflow}$ voltage rail. Input output cell 72 provides a signal to a further peripheral device 84.

FIG. 4b shows a cross-sectional view of how the connections are made from the pins to the edge of the integrated circuit and from there to the silicon in which the core 60 is formed.

Figure 5:
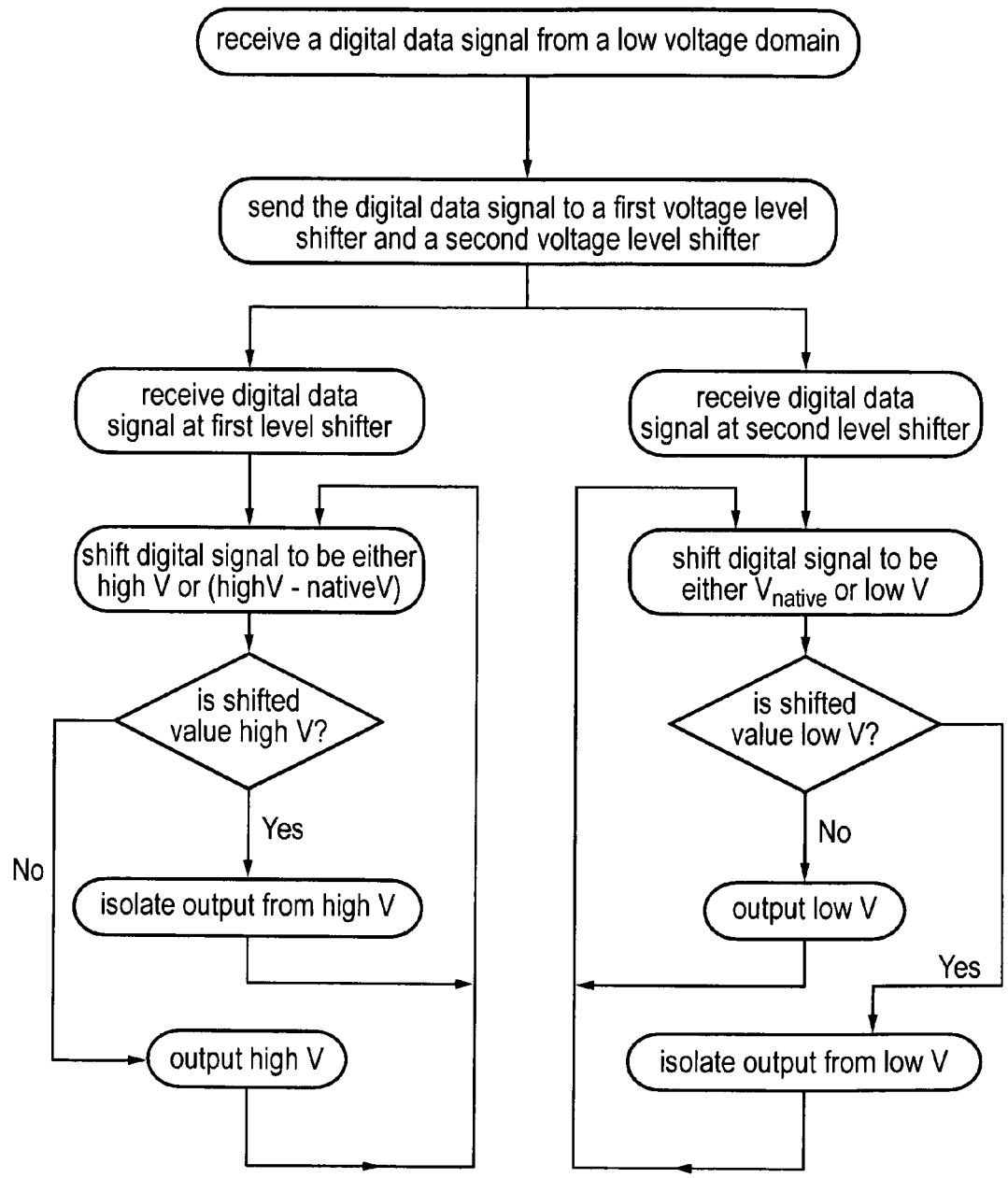
FIG. 5 shows a flow diagram illustrating steps in a method according to an embodiment of the present invention.

FIG. 5 shows a flow diagram illustrating steps in a method for level shifting an input digital data signal from a low voltage domain to a higher voltage domain. Thus, initially the digital data signal is received from the low voltage domain and is sent to both a first voltage level shifter and a second voltage level shifter. The first voltage level shifter shifts the digital data signal to the level of the high voltage domain high V or to the intermediate reference low voltage level (high V−native V). The signal sent to the second level shifter is shifted to a lower voltage domain which has native V as its high voltage level and lowV the low voltage level of the voltage domains as its low level. In this way voltage signals that have different voltage levels but each have a voltage difference of nativeV are generated.

The method then either connects or isolates the high voltage level high V from the output in response to the value of the first level shifted signal. Similarly low V is either isolated from or connected to the output in response to the second level shifted signal. Thus, depending on the value of the input digital data signal either the high voltage level is output or the low voltage level are connected to the output and in this way the input digital data signal is level shifted to a corresponding digital data signal in the higher voltage domain. It should be noted that the signal is also inverted but this can be corrected for by using a simple inverter which is often required to buffer a signal in any case.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. Circuitry for handling a digital signal, said circuitry comprising a high voltage input for receiving a high voltage level and a low voltage input for receiving a low voltage level, said circuitry comprising:

a plurality of devices, said plurality of devices being designed to operate optimally when powered in a native voltage domain, wherein when said low voltage level is equal to a low native voltage level, a high native voltage level is lower than said high voltage level;

a further input for receiving said high native voltage level;

at least some of said plurality of devices of said circuitry being arranged in two sets, each set having at least one device, a first set being arranged in an upper voltage domain having an intermediate low reference voltage level as a low voltage level and said high voltage level as a high voltage level and a second set being arranged in a lower voltage domain having said high native voltage level as a high voltage level and said low voltage level as a low voltage level; wherein said intermediate low reference voltage level comprises a voltage level generated by subtracting said high native voltage level from said high voltage level, such that said devices of said first and said second set operate at or close to an optimal operating voltage difference.

2. Circuitry according to claim 1, said circuitry further comprising:

a voltage level generator configured to generate said intermediate low reference voltage level, said voltage level generator receiving said high voltage level and said high native voltage level and comprising voltage difference generation means for generating a voltage level equal to the voltage difference between said received high voltage level and said received high native voltage level and outputting said voltage difference as said intermediate low reference voltage level.

3. Input output circuitry comprising circuitry according to claim 1, and a data input for receiving an input digital data signal having an input high voltage level that is lower than said high voltage level and an input low voltage level at said low voltage level and a data output for outputting a digital data signal having said high voltage level and said low voltage level; wherein said first set of devices comprises a first voltage level shifter powered between said high voltage level and said intermediate low reference voltage level and configured to shift said voltage level of said received input digital data signal from said input high voltage level to said high voltage level and said input low voltage level to said intermediate low reference voltage level; and said input output circuitry comprises a first switching device configured to connect or isolate said high voltage level and an output, said first switching device being controlled by said signal output by said first voltage level shifter;

said second set of devices comprises a second voltage level shifter powered between said native high voltage level and said low voltage level and configured to shift said high voltage level of said received input digital data signal to said high native voltage level; and said input output circuitry comprises a second switching device configured to connect or isolate said low voltage level and said output, said second switching devices being controlled by said signal output by said second voltage level shifter.

4. Input output circuitry according to claim 3, wherein said first voltage level shifter comprises a pre-driver powered between said high voltage level and said intermediate low reference voltage level and said second voltage level shifter comprises a pre-driver powered between said high native voltage level and said low voltage level.

5. Input output circuitry according to claim 3, wherein said first switching device comprises a PMOS transistor arranged in series with a further at least one PMOS transistor, said further at least one PMOS transistor being configured to receive said intermediate low reference voltage at its gate.

6. Input output circuitry according to claim 5, wherein said second switching device comprises a NMOS transistors arranged in series with a further at least one NMOS transistor, said further at least one NMOS transistor being configured to receive said high native voltage level at its gate.

7. An integrated circuit comprising:
a plurality of components including at least one core for generating a data signal;
a plurality of voltage rails configured to transmit voltage levels to said plurality of components, said plurality of voltage rails comprising:
a first voltage rail comprising a high voltage rail for transmitting a high voltage level;
a second voltage rail comprising a low voltage rail for transmitting a low voltage level;
a third voltage rail for transmitting an intermediate voltage level that is lower than said high voltage level, said intermediate voltage level being a high voltage level for powering said processor core;
an input output cell for receiving said data signal from said core and for converting a high voltage level of said data signal to a higher voltage level, said input output cell comprising input output circuitry according to claim 3.

8. An integrated circuit according to claim 7, said input output cell further comprising:
a voltage level generator for generating said intermediate low reference voltage level, said voltage level generator receiving said high voltage level and said high native voltage level and comprising voltage difference generation means for generating a voltage level equal to the voltage difference between said received high voltage level and said received high native voltage level and outputting said voltage difference as said intermediate low reference voltage level.

9. An integrated circuit according to claim 8, said integrated circuit further comprising:
a fourth voltage rail for receiving said intermediate low reference voltage level from said voltage level generator of said input output cell and for transmitting said intermediate low reference voltage; said integrated circuit further comprising a further input output cell comprising circuitry according to claim 3, said further input output cell receiving said intermediate low reference voltage from said fourth voltage rail.

10. A means for handling a digital signal, said means comprising a high voltage input means for receiving a high voltage level and a low voltage input means for receiving a low voltage level, said means for handling data comprising:
a plurality of devices, said plurality of devices being designed to operate optimally powered between a native voltage difference, wherein when said low voltage level is equal to a low native voltage level, a high native voltage level is lower than said high voltage level;
a further input means for receiving said high native voltage level;
a voltage level generator means for generating an intermediate low reference voltage level, said voltage level generator means receiving said high voltage level and said high native voltage level and comprising voltage difference generation means for generating a voltage level equal to the voltage difference between said received high voltage level and said received high native voltage level and outputting said voltage difference as said intermediate low reference voltage level; and
a data input means for receiving an input digital data signal having an input high voltage level that is lower than said high voltage level and an input low voltage level at said low voltage level and a data output means for outputting a digital data signal having said high voltage level and said low voltage level; wherein
at least some of said plurality of devices of said circuitry are arranged in two sets, each set having at least one device, a first set being powered between said high voltage level and said intermediate low reference voltage level and a second set being powered between said high native voltage level and said low voltage level such that said devices of said first and said second set operate at or close to an optimal operating voltage difference.

11. A method for handling a digital signal, using circuitry powered in a high voltage domain between a high voltage level and a low voltage level, said circuitry comprising a plurality of devices, said plurality of devices being designed to operate optimally powered between a native voltage difference, wherein when said low voltage level is equal to a low native voltage level, a high native voltage level is lower than said high voltage level;
said method comprising:
receiving said high voltage level of said high voltage domain;
receiving said high native voltage level;
receiving said low voltage level;
generating an intermediate low reference voltage level by subtracting said high native voltage level from said high voltage level of said high voltage domain;
arranging at least some of said plurality of devices of said circuitry in two sets, each set having at least one device, a first set being arranged to receive said intermediate low reference voltage level as a low voltage level signal and said high voltage level as a high voltage level signal and a second set being arranged to receive said high native voltage level as a high voltage level signal and said low voltage level as a low voltage level signal.

12. A method according to claim 11 further comprising:
receiving an input digital data signal having an input high voltage level that is lower than said high voltage level and an input low voltage level at said low voltage level; and generating and outputting a digital data signal in said high voltage domain having said high voltage level and said low voltage level; wherein said step of generating and outputting said digital data signal in said high voltage domain comprises:
  level shifting said received input digital data signal using said first set of devices from said input high voltage level to said high voltage level and said input low voltage level to said intermediate low reference voltage level; and
  controlling a first switching device using said level shifted input digital data signal to connect or isolate said high voltage level to an output to output a high voltage level in response to said digital input data signal having said input high voltage level; and
  level shifting said received input digital data signal using said second set of devices from said input high voltage level to said native high voltage level; and
  controlling a second switching device using said level shifted input digital data signal to connect or isolate said low voltage level to an output to output a low voltage level in response to said digital input data signal having said input low voltage level.

* * * * *